(12) United States Patent
Shabbir et al.

(10) Patent No.: US 11,592,880 B2
(45) Date of Patent: Feb. 28, 2023

(54) SYSTEM AND METHOD FOR AUTOMATION OF BASELINE FAN SPEEDS

(71) Applicant: DELL PRODUCTS L.P., Round Rock, TX (US)

(72) Inventors: Hasnain Shabbir, Round Rock, TX (US); Carlos Guillermo Henry, Round Rock, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 371 days.

(21) Appl. No.: 16/851,289

(22) Filed: Apr. 17, 2020

(65) Prior Publication Data
US 2021/0325947 A1     Oct. 21, 2021

(51) Int. Cl.
| | |
|---|---|
| G06F 1/20 | (2006.01) |
| G05B 19/4155 | (2006.01) |
| H05K 7/20 | (2006.01) |
| G01K 7/42 | (2006.01) |

(52) U.S. Cl.
CPC ............... *G06F 1/20* (2013.01); *G01K 7/425* (2013.01); *G05B 19/4155* (2013.01); *G06F 1/206* (2013.01); *H05K 7/20209* (2013.01); *G05B 2219/49216* (2013.01)

(58) Field of Classification Search
None
See application file for complete search history.

(56) References Cited

U.S. PATENT DOCUMENTS

| | | | |
|---|---|---|---|
| 6,350,711 B1 | 2/2002 | Potts et al. | |
| 6,400,565 B1 | 6/2002 | Shabbir et al. | |
| 6,573,671 B2 | 6/2003 | Montero et al. | |
| 7,275,019 B2 | 9/2007 | Schulke et al. | |
| 7,505,870 B2 | 3/2009 | Schulke et al. | |
| 7,876,559 B2 | 1/2011 | Shabbir et al. | |
| 8,604,933 B2 | 12/2013 | Berke et al. | |
| 9,250,649 B2 | 2/2016 | Shabbir et al. | |
| 9,250,664 B2 | 2/2016 | Artman et al. | |
| 9,494,954 B2 | 11/2016 | Artman et al. | |
| 9,519,323 B2 | 12/2016 | Shabbir et al. | |
| 9,521,780 B2 * | 12/2016 | Ragupathi | H05K 7/20209 |
| 9,558,527 B2 | 1/2017 | Sierra et al. | |
| 9,594,568 B2 | 3/2017 | Shabbir et al. | |
| 9,606,585 B2 | 3/2017 | Tunks et al. | |
| 9,645,634 B2 | 5/2017 | Shabbir et al. | |
| 9,671,839 B2 | 6/2017 | Peterson et al. | |
| 9,681,577 B2 | 6/2017 | Ragupathi et al. | |
| 9,743,552 B2 | 8/2017 | Ragupathi et al. | |
| 9,785,208 B2 | 10/2017 | Lovicott et al. | |
| 9,819,722 B2 | 11/2017 | Ragupathi et al. | |
| 9,823,636 B2 | 11/2017 | Shabbir et al. | |
| 9,875,632 B2 | 1/2018 | Kunnathur Ragupathi et al. | |
| 9,952,639 B2 | 4/2018 | Shabbir et al. | |

(Continued)

*Primary Examiner* — Eric C Wai
(74) *Attorney, Agent, or Firm* — Jackson Walker LLP; Christopher J. Rourk

(57) ABSTRACT

A system for controlling one or more fans, comprising an open loop control system configured to receive a CPU power level and to maintain a fan speed at an open loop fan speed level. A closed loop control system configured to receive the CPU power level and temperature, and to modify the fan speed as a function of the CPU power level and temperature, wherein the fan speed is maintained at a level that is not lower than the open loop fan speed level.

20 Claims, 5 Drawing Sheets

(56) References Cited

U.S. PATENT DOCUMENTS

| | | |
|---|---|---|
| 9,965,020 B2 | 5/2018 | Shabbir et al. |
| 9,968,011 B2 | 5/2018 | Shabbir et al. |
| 9,974,210 B2 | 5/2018 | Kunnathur Ragupathi et al. |
| 10,019,778 B2 | 7/2018 | Sierra et al. |
| 10,078,610 B2 | 9/2018 | Kunnathur Ragupathi et al. |
| 10,095,288 B2 | 10/2018 | Shabbir et al. |
| 10,101,782 B2 | 10/2018 | Shabbir et al. |
| 10,130,014 B2 | 11/2018 | Shabbir et al. |
| 10,136,558 B2 | 11/2018 | Shabbir et al. |
| 10,146,190 B2 | 12/2018 | Lovicott et al. |
| 10,168,748 B2 | 1/2019 | Shabbir et al. |
| 10,203,733 B2 | 2/2019 | Ragupathi et al. |
| 10,212,844 B2 | 2/2019 | Ragupathi et al. |
| 10,254,807 B2 | 4/2019 | Shabbir et al. |
| 10,289,177 B2 | 5/2019 | Shabbir et al. |
| 10,296,060 B2 | 5/2019 | Shabbir et al. |
| 10,353,357 B2 | 7/2019 | Shabbir et al. |
| 10,353,446 B2 | 7/2019 | Lovicott et al. |
| 10,390,463 B2 | 8/2019 | Shabbir et al. |
| 10,405,461 B2 | 9/2019 | Shabbir et al. |
| 10,409,595 B2 | 9/2019 | Shabbir et al. |
| 10,430,251 B2 | 10/2019 | Ragupathi et al. |
| 10,459,499 B2 | 10/2019 | Shabbir et al. |
| 10,481,655 B2 | 11/2019 | Ragupathi et al. |
| 10,496,560 B2 | 12/2019 | Shabbir et al. |
| 10,506,743 B2 | 12/2019 | Lovicott et al. |
| 10,571,978 B2 * | 2/2020 | Haley ................ F04D 27/004 |
| 10,582,646 B2 | 3/2020 | Shabbir et al. |
| 10,627,880 B2 | 4/2020 | Shabbir et al. |
| 10,671,132 B2 | 6/2020 | Artman et al. |
| 10,678,313 B2 | 6/2020 | Shabbir et al. |
| 2010/0122792 A1 | 5/2010 | Shabbir et al. |
| 2011/0090087 A1 | 4/2011 | Berke et al. |
| 2013/0226364 A1 | 8/2013 | Artman et al. |
| 2015/0095270 A1 | 4/2015 | Shabbir et al. |
| 2015/0116929 A1 | 4/2015 | Shabbir et al. |
| 2016/0037686 A1 | 2/2016 | Shabbir et al. |
| 2016/0182338 A1 | 6/2016 | Ragupathi et al. |
| 2017/0269653 A1 | 9/2017 | Shabbir et al. |
| 2017/0269654 A1 | 9/2017 | Shabbir et al. |
| 2017/0273215 A1 | 9/2017 | Shabbir et al. |
| 2017/0273224 A1 | 9/2017 | Shabbir et al. |
| 2017/0303438 A1 | 10/2017 | Shabbir et al. |
| 2017/0315568 A1 | 11/2017 | Lovicott et al. |
| 2017/0318707 A1 | 11/2017 | Shabbir et al. |
| 2017/0318708 A1 | 11/2017 | Shabbir et al. |
| 2017/0329651 A1 | 11/2017 | Ragupathi et al. |
| 2017/0357299 A1 | 12/2017 | Shabbir et al. |
| 2018/0335812 A1 | 11/2018 | Shabbir et al. |
| 2018/0341301 A1 | 11/2018 | Shabbir et al. |
| 2018/0341302 A1 | 11/2018 | Shabbir et al. |
| 2018/0341485 A1 | 11/2018 | Shabbir et al. |
| 2018/0352681 A1 | 12/2018 | Shabbir et al. |
| 2018/0359882 A1 | 12/2018 | Lovicott et al. |
| 2019/0324506 A1 | 10/2019 | Shabbir et al. |
| 2019/0339752 A1 | 11/2019 | Shabbir et al. |
| 2019/0339753 A1 | 11/2019 | Shabbir et al. |
| 2019/0340139 A1 | 11/2019 | Shabbir et al. |
| 2020/0042052 A1 | 2/2020 | Shabbir et al. |
| 2020/0042056 A1 | 2/2020 | Shabbir et al. |

* cited by examiner

FIG. 5    500

SYSTEM AND METHOD FOR AUTOMATION OF BASELINE FAN SPEEDS

TECHNICAL FIELD

The present disclosure relates generally to computer equipment, and more specifically to a system and method for automation of baseline fan speeds that prevents component temperature spikes from hitting their operating temperature limits, due to slow closed loop response.

BACKGROUND OF THE INVENTION

Cooling systems for processors are known, but are typically closed loop controllers that can result in temperature spikes that exceed design levels.

SUMMARY OF THE INVENTION

A system for controlling one or more fans is disclosed that includes an open loop control system that is configured to receive a CPU power level and to maintain a fan speed at an open loop fan speed level. A closed loop control system is also provided that can receive the CPU power level and temperature and that can modify the fan speed as a function of the CPU power level and temperature, wherein the fan speed is maintained at a level that is not lower than the open loop fan speed level.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which.

DETAILED DESCRIPTION OF THE INVENTION

Figure 1:
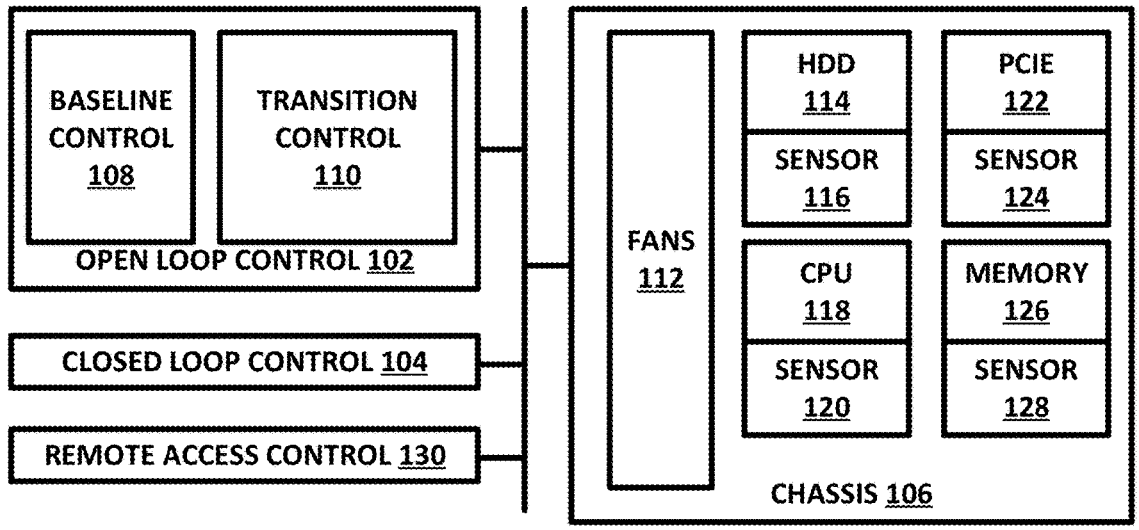
FIG. 1 is a diagram of a system for transitioning between open loop and closed loop cooling control, in accordance with an example embodiment of the present disclosure.

In the description that follows, like parts are marked throughout the specification and drawings with the same reference numerals. The drawing figures may be to scale, and certain components can be shown in generalized or schematic form and identified by commercial designations in the interest of clarity and conciseness.

As central processor unit (CPU) thermal design power (TDP) and CPU TDP per core increases, so does the transient behavior of the temperature sensor in each core. This problem can be worse during a transition from an idle CPU condition to a full CPU workload, where a temperature rise in a CPU core can be very high, such as an increase from 43° C. to 93° C. in less than one second. A fan-based cooling solution and the associated control algorithm for the fans is typically unable to prevent a spike of this magnitude.

System baseline fan speeds are generally planned to be low unless an individual component, based on a closed-loop control, requires a higher fan speed, or if another sub-system that does not have temperature sensing requires an open-loop fan speed response (such as based on factors other than a sensed temperature). These design configurations can result in undesirable temperature spikes.

A predictive logic algorithm is disclosed that uses CPU power and a CPU core count to estimate an expected CPU temperature jump if CPU loading suddenly increases from a standby mode to a fully-loaded configuration (while CPU power level is used in this disclosure, the same principles can apply to memory devices, data communications devices, graphics processing units (GPU) or other system components). The CPU temperature margin that needs to be maintained is then determined and is used to prevent a CPU temperature transient spike from reaching a maximum temperature limit (sometimes referred to as processor hot or "prochot"). This margin value is the CPU final cooling target, minus the CPU jump. In one example embodiment, the present disclosure allows the fans to be operated at a minimum level that is higher than might otherwise be selected based strictly on CPU power, but at less than a maximum fan setting, where the fan level is based on the level at which a CPU power transient to full CPU power can be adequately cooled, without exceeding CPU temperature limits.

To accomplish this, the present disclosure uses a CPU load line curve to calculate the CPU power that would be considered "idle power" at which to maintain the CPU idle temp, which is the open loop target. If this is not done, then it can be difficult to distinguish when to stop open loop control and to let a closed loop process take control. The present disclosure thus calculates a required fan speed to maintain the open loop target at the open loop CPU power level, which may be referred to as the "idle zone," using the case to ambient thermal resistance, or $\Theta_{CA}$, curve of the CPU heatsink.

If the current CPU power load is greater than the idle load (idle load is termed as open loop [OL] power level), automated baseline fan speed ("ABFS") control will be capped to the OL power level fan speed. The OL power-based fan speed will not be adjusted beyond this CPU power level, and if additional cooling is needed, an adaptive ("ADP") closed loop ("CL") controller can be used to control fan speeds above that level. Transitioning from an OL operating regime to a CL operating regime in this manner using the disclosed system is novel and unique.

The present disclosure uses CPU power and core count to estimate the increase in CPU heating, or "core jump." In one example embodiment, the open loop CPU target temperature (OLT) can be calculated by subtracting the core jump from the CPU target. The CPU load line curve can be used to calculate the maximum power supported (OLP) for OLT, and then the baseline fan speed (BFS) can be calculated for use while the system is in an idle state, where the current power being consumed is less than or equal to OLP. The BFS can be obtained by using the current $\Theta_{CA}$ with a heat sink performance curve. If the current power is greater than the OLP, then the system switches to open loop baseline fan speed control at OLP.

The present disclosure provides for automated baseline fan speed determination in the current system configuration, as opposed to a static OL baseline fan speed, which provides a novel and non-obvious way to control fan speeds in the disclosed system configuration, as well as in other suitable systems. The disclosed algorithm or other suitable algorithms can be used to accomplish this fan speed control. In addition, the determination of an OL baseline fan speed based on CPU cooling curve and the determination of a transition point from OL to CL control to ensure that the OL control is not the dominant means to control temperature is also provided. The prior art does not automate a definition of a baseline OL fan speed in a server platform In one example embodiment, CPU TDP and active core count can be read by a remote access controller and used to predict a maximum temperature spike, where the temperature spike is a function of the relationship of TDP and the active core count (TDP/Core #), and can be described by the following formula (example):

Temperature spike=1.3393(TDP/Core#)+6.4821

For example, a 165 Watt load for a 24 Core processor would have an estimated temperature spike of approximately 16° C.:

Temperature spike=1.3393(165/24)+6.4821

Temperature spike=15.7° C.

The CPU load line can be used to calculate the OL target temperature and the OL supported power. The CPU load line specification is available to read by a remote access controller.

The OL target temperature can be determined by subtracting the calculated temperature spike from the CPU cooling target:

OL Target=Cooling Target−Temperature Spike

The supported OL power can be calculated by determining how much power can be supported for a given OL Target:

Supported OL Power=(OLTarget−Intercept)/Slope

For example, for a 165 Watt load and a 24 Core processor with an estimated temperature spike of 16° C., a temperature target of 88° C. and a load line target=0.3030(Pwr)+47 yields the following:

OL Target = 88° C.−16° C.
= 72° C.

Supported OL Power = (72 − 47)/0.3030 = 83 W

To determine the heatsink performance versus airflow to calculate a maximum OL baseline fan speed, a previously characterized heatsink performance ($\Theta_{CA}$) vs airflow (Fan PMW) curve can be used. For example, the OL $\Theta_{CA}$ can be determined using the following formula:

OL $\Theta_{CA}$=(OL Target−T inlet)/Supported OL Power

By using OL $\Theta_{CA}$ with the heatsink performance curve, the OL baseline fan speed can be determined. For example, if the OL target is 72° C., the inlet temperature is 25° C. and the supported OL power is 83 Watts, the maximum OL baseline fan speed can be be 46% PWM.

OL $\Theta_{CA}$=(72−25)/83=0.566

Baseline=−501.25(0.566)$^5$+2236.6(0.566)$^4$−4000.5 (0.566)$^3$+3668.1(0.566)$^2$−1817.4(0.566)+424.77

Baseline=46% PWM

For a transition from an idle mode of operation (OL) to a stress mode of operation (CL) based on CPU temperature zones, the algorithm can maintain the OL baseline fan speed up to 83 Watts of CPU power. After than power level, the algorithm can switch to ADP CL control to take over and to cool the CPU to the CPU cooling target.

The present disclosure can use a CPU heatsink performance curve that provides the value of $\Theta_{CA}$ as a function of the cubic feet per minute (CFM) of air flow, such as for configurations defined in a platform thermal table or in other suitable manners. The value of $\Theta_{CA}$ can be based on in-system characterization, as opposed to a standalone heatsink $\Theta_{CA}$, and the ambient air temperature can be selected as the air temperature at the system inlet, as opposed to the air temperature at the inlet to CPU. The thermal table settings allow this feature to be turned on or off via remote access controller, which also allow modification of the fan speed scaling factor where needed. The scaling factor allows the OL final fan speed to be scaled up or down.

FIG. 1 is a diagram of a system 100 for transitioning between open loop and closed loop cooling control, in accordance with an example embodiment of the present disclosure. System 100 includes open loop control 102, closed loop control 104, chassis 106, baseline control 108, transition control 110, fans 112, hard disk drive (HDD) 114, peripheral component interconnect express (PCIE) 122, CPU 118, memory 126, remote access control 130 and sensors 116, 120, 124 and 128, each of which can be implemented in hardware or a suitable combination of hardware and software.

Open loop control 102 can be implemented as one or more algorithms operating on a processor (which can be a dedicated processor, a special purpose processor or other suitable processors, but typically not CPU 118 unless otherwise suitable) that cause the processor to perform the functions of receiving a control setting for fans 112 and setting fan speeds for fans 112. In one example embodiment, the fan setting can be determined as a function of CPU heat loading for CPU 118, hard disk drive heat loading for HDD 114, peripheral component interconnect express heat loading for PCIE 122, memory heat loading for memory 126 and other suitable heat loads. In this example embodiment, the open loop control setting can be a function of a cooling efficiency $\Theta_{CA}$ for a heat sink assembly for heat sinks associated with the thermal load, such as where the idle load is used to determine a maximum open loop control setting. Open loop control 102 can maintain a cooling level that is to be used until a heat load increases, or other suitable functions can also or alternatively be provided. Open loop control 102 can be implemented as a local system for chassis 106, as a remote system in a remote access controller, can be a local system that is configured by the remote access controller when the remote access controller reads system configuration data for chassis 106 or can be configured in other suitable manners.

Closed loop control 104 can be implemented as one or more algorithms operating on a processor (which can be a dedicated processor, a special purpose processor or other suitable processors, but typically not CPU 118 unless otherwise suitable) that cause the processor to perform the functions of receiving a control setting for fans 112 and sensor data for sensors 116, 120, 124 and 128 and setting fan speeds for fans 112. Closed loop control 104 can use the target temperature from CPU 118 (or other suitable system components), real time temperature data for CPU 118, CPU 118 power and the transitory behavior characteristics of CPU 118 to determine a speed response for fans 112. The present disclosure uses one or more processors other than CPU 118 to implement one or more algorithms for determination of the open loop speed for fans 112, up to a predetermined power level of CPU 118, and a transition from open loop control 102 to an adaptive closed loop control. In one example embodiment, the fan setting can be determined as a function of CPU heat loading for one or more of CPU 118, hard disk drive heat loading for HDD 114, peripheral component interconnect express heat loading for PCIE 122, memory heat loading for memory 126 and other suitable heat loads, such as a GPU. In this example embodiment, the closed loop fan control setting can be a function of a cooling efficiency $\Theta_{CA}$ for a heat sink assembly for heat sinks associated with the thermal load, such as where the thermal load is determined from sensor readings of sensors 116, 120, 124 and 128 and is used to determine a closed loop control setting. Closed loop control 104 can maintain a fan speed associated with a cooling level that is used after a heat load has increased beyond a fan speed associated with a predetermined level of cooling to accommodate for temperature transients, and can change dynamically, or other suitable functions can also or alternatively be provided. Closed loop control 102 can be implemented as a local system for chassis 106, as a remote system in a remote access controller, can be a local system that is configured by the remote access controller when the remote access controller reads system configuration data for chassis 106 or can be configured in other suitable manners.

Chassis 106 can be a housing or other suitable structure that includes fans 112, HDD 114, CPU 118, PCIE 122, memory 126 and other suitable components, and provides part of the cooling function for the components contained within it. In one example embodiment, the arrangement of the components and associated heat sinks can be used to determine a heat sink performance curve for use in determining a fan speed to accomplish a level of cooling.

Baseline control 108 can be implemented as one or more algorithms operating on a processor (which can be a dedicated processor, a special purpose processor or other suitable processors, but typically not CPU 118 unless otherwise suitable) that cause the processor to perform the functions of receiving a control setting for fans 112 and setting fan speeds for fans 112. In one example embodiment, the fan setting can be set in response to a control signal that causes baseline control 108 to be active, and can be based on control data received from a remote access controller or other suitable data, such as a CPU loading level that is used to determine whether to use open loop control or closed loop control.

Transition control 110 can be implemented as one or more algorithms operating on a processor (which can be a dedicated processor, a special purpose processor or other suitable processors, but typically not CPU 118 unless otherwise suitable) that cause the processor to perform the functions of receiving a control setting for fans 112 and transitioning control of fan speeds for fans 112 from open loop control 102 to closed loop control 104. In one example embodiment, the fan setting can be set in response to a control signal that causes baseline control 108 to be inactivated, and can be based on control data received from a remote access controller or other suitable data, such as a CPU loading level that is used to determine whether to use open loop control or closed loop control. Transition control 110 can be used to prevent oscillation or other problems from occurring if the power load fluctuates or otherwise would cause rapid changes in selection of open loop control 102 and closed loop control 104, or in other suitable embodiments.

Fans 112 can be configured to provide cooling to one or more cooling pathways, as a function of a design of chassis 106, HDD 114, CPU 118, PCIE 122, memory 126 and other suitable devices. In one example embodiment, fans 112 can have a predetermined response characteristic to allow the amount of air flow that is generated as a function of a CPU power level to be determined, or other suitable control characteristics can also or alternatively be used. Fans 112 can be one or more fans that are disposed in a linear configuration, in a staggered configuration, in a stacked configuration, in a layered configuration or in other suitable embodiments.

HDD 114 is a data storage device that has a predetermined heat load. In one example embodiment, the heat load generated by HDD 114 can be a function of the power consumed by HDD 114, or other suitable factors. The heat load generated by HDD 114 can also change over time, such as in response to aging, temperature or in other manners. HDD 114 can be one or more data storage devices that are disposed in a linear configuration, in a staggered configuration, in a stacked configuration, in a layered configuration or in other suitable embodiments.

PCIE 122 is a data communication device that has a predetermined heat load. In one example embodiment, the heat load generated by PCIE 122 can be a function of the power consumed by PCIE 122, or other suitable factors. The heat load generated by PCIE 122 can also change over time, such as in response to aging, temperature or in other manners. PCIE 122 can be one or more data communications systems that are disposed in a linear configuration, in a staggered configuration, in a stacked configuration, in a layered configuration or in other suitable embodiments.

CPU 118 is a data processing device that can include one or more individual processing units, such as where CPU 118 is an individual processor, a multi-core processor or other suitable devices. The processors of CPU 118 can be disposed in a suitable configuration when there is more than one processor, such as in a linear configuration, in a staggered configuration, in a stacked configuration, in a layered configuration or in other suitable embodiments. In one example embodiment, the heat load generated by CPU 118 can be a function of the power consumed by CPU 118, or other suitable factors. The heat load generated by CPU 118 can also change over time, such as in response to aging, temperature or in other manners.

Memory 126 is a data storage device that has a predetermined heat load. In one example embodiment, the heat load generated by memory 126 can be a function of the power consumed by memory 126, or other suitable factors. The heat load generated by memory 126 can also change over time, such as in response to aging, temperature or in other manners.

Sensors 116, 120, 124 and 128 can be temperature sensing devices such as thermocouples, resistance temperature detectors, thermistors, integrated circuits or other suitable devices. In one example embodiment, sensors 116, 120, 124 and 128 can be used to determine a temperature of an associated device or devices, such as HDD 114, CPU 118, PCIE 122 and memory 126, respectively. Sensors 116, 120, 124 and 128 can provide signals to closed loop control 104, open loop control 102 or other suitable systems or devices.

Remote access control 130 can be implemented as one or more algorithms operating on a processor that cause the processor to perform the functions of calculating a baseline fan speed for fans 112 as a function of a case to ambient thermal resistance. In one example embodiment, remote access control 130 can determine the configuration of the cooling assembly and generate the baseline fan speed for a remote open loop control 102 and other suitable systems.

In operation, system 100 can be used to select between open loop control and closed loop control for fan speed control for a chassis, to prevent temperature excursions in CPU temperatures that can result from very fast CPU core temperature transients. System 100 determines a baseline cooling level as a function of the temperature increase that can result from an increase in CPU power, and maintains the fan speed at a level that allows the temperature increase to be successfully reduced, even during no-load conditions. In this manner, a component temperature excursion risk can be avoided, that would otherwise be allowed to exist if closed loop control alone were used.

Figure 2:
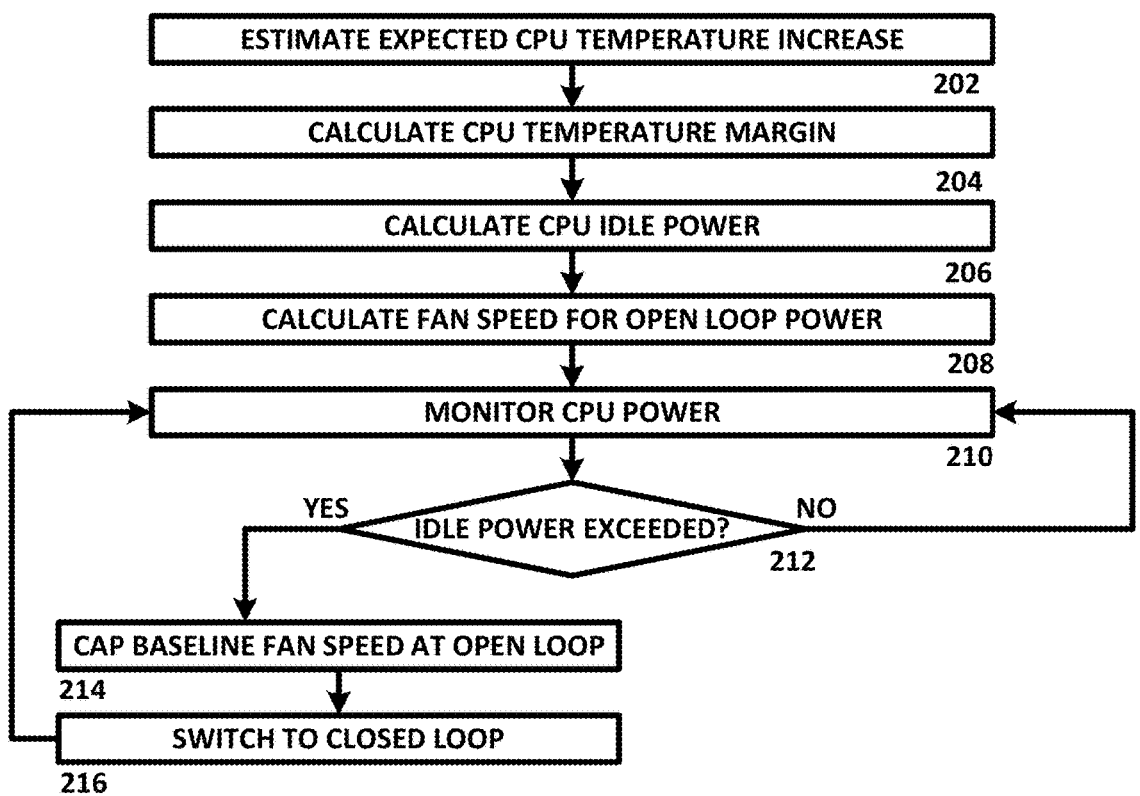
FIG. 2 is a diagram of an algorithm for transitioning between open loop and closed loop cooling control, in accordance with an example embodiment of the present disclosure.

FIG. 2 is a diagram of an algorithm 200 for transitioning between open loop and closed loop cooling control, in accordance with an example embodiment of the present disclosure. Algorithm 200 can be implemented as one or more algorithms operating on one or more processors, or in other suitable manners.

Algorithm 200 begins at 202, where an expected CPU temperature increase is estimated. In one example embodiment, the expected CPU temperature increase can be estimated by reading the CPU power level and CPU core count, calculating the ratio of these two values, and using a pre-characterized correlation between the ratio and expected instantaneous temperature spike, stored in the management controller based thermal table. The algorithm then proceeds to 204.

At 204, a CPU temperature margin is calculated. In one example embodiment, the temperature margin can include an operating temperature that needs to be maintained in order to prevent the estimated increase in instantaneous temperature from resulting in an increase above a design temperature value, such as can occur if the CPU temperature is maintained by closed loop control with the only constraint being the maximum temperature. The algorithm then proceeds to 206.

At 206, a CPU idle power is calculated. In one example embodiment, the CPU idle power can be the power level having an associated temperature that needs to be maintained to prevent the increase in temperature from a sudden increase to full load from exceed a design maximum temperature. When the CPU idle power is exceeded, the system can switch from open loop control to closed loop control. The algorithm then proceeds to 208.

At 208, a fan speed for CPU open loop power limit is generated. In one example embodiment, the fan speed can be set to a level that results in sufficient cooling at the CPU open loop power limit to prevent an excessive transient temperature spike causing the CPU temperature to go over design limit. The algorithm then proceeds to 210.

At 210, a CPU power level is monitored. In one example embodiment, CPU power levels can be monitored by calculating an instantaneous power from current and voltage data, or in other suitable manners. The algorithm then proceeds to 212.

At 212, it is determined whether the CPU power level is greater than the idle CPU power level. If it is determined that the fan power level is greater than the idle fan power level, the algorithm proceeds to 214, otherwise the algorithm returns to 210.

At 214, the cooling baseline is capped at the open loop level. In one example embodiment, the cooling baseline can be capped to prevent closed loop control from decreasing the cooling level below a level that is needed to prevent an instantaneous temperature increase above the maximum design temperature. The algorithm then proceeds to 216.

At 216, the algorithm switches to closed loop control. In one example embodiment, closed loop control can be maintained by using temperature sensor inputs to calculate an increase in fan speed over a baseline fan speed, where the minimum fan speed is the fan speed that is determined to be necessary to prevent an over-temperature event from occurring. The algorithm then returns to 210.

In operation, algorithm 200 allows cooling to be transitioned between open loop control and closed loop control, to prevent generation of temperature spikes that can cause CPU temperature to exceed design limit. Although algorithm 200 is shown as a flow chart, algorithm 200 can also or alternatively be implemented using object oriented programming, state diagrams, ladder diagrams or in other suitable manners.

Figure 3:
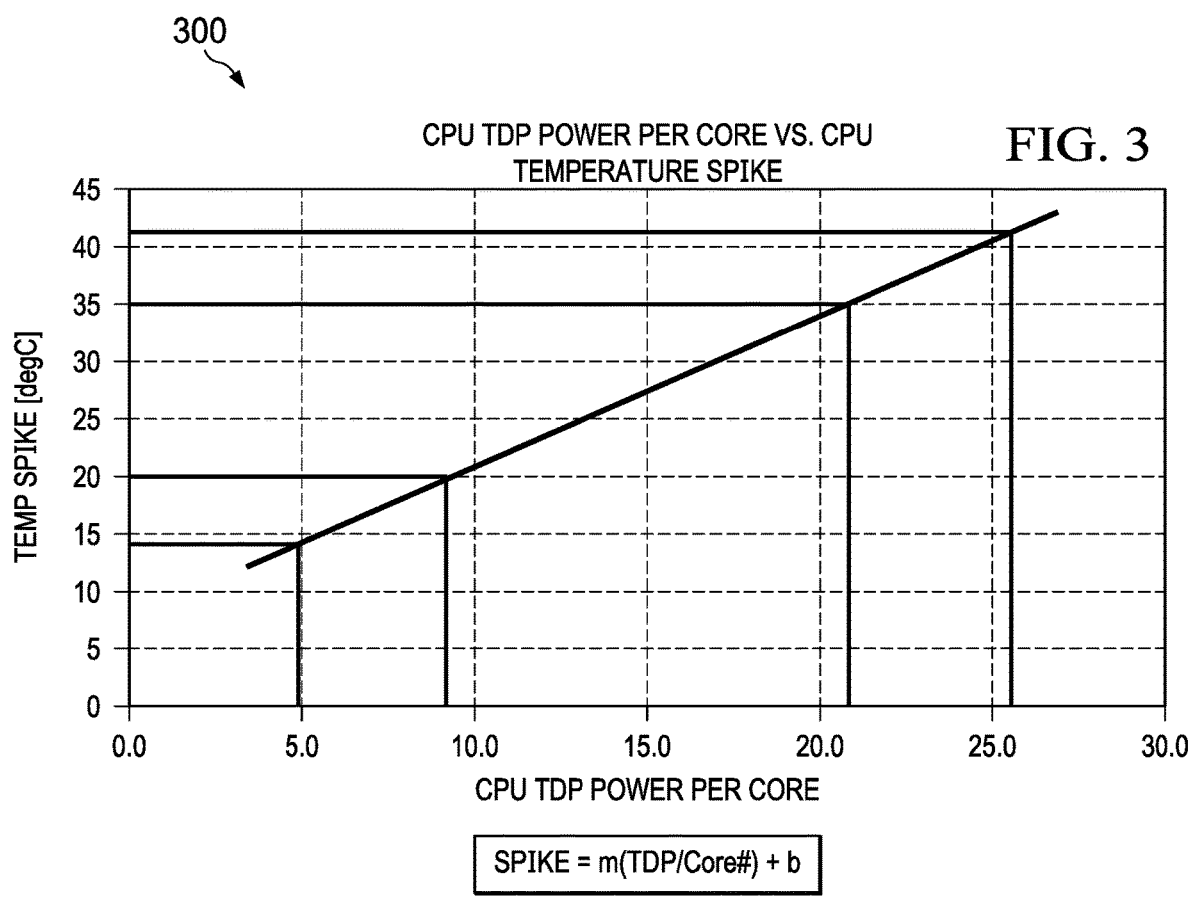
FIG. 3 is a diagram of a control characteristic for CPU temperature spike as a function of CPU TDP power per core, in accordance with an example embodiment of the present disclosure.

FIG. 3 is a diagram 300 of a control characteristic for CPU temperature spike as a function of CPU TDP power per core, in accordance with an example embodiment of the present disclosure. As shown in diagram 300, the temperature of the CPU or CPU assembly has a linear relationship to the CPU TDP power per core, such that the temperature spike can be determined based on a known value of the CPU TDP power per core.

Figure 4:
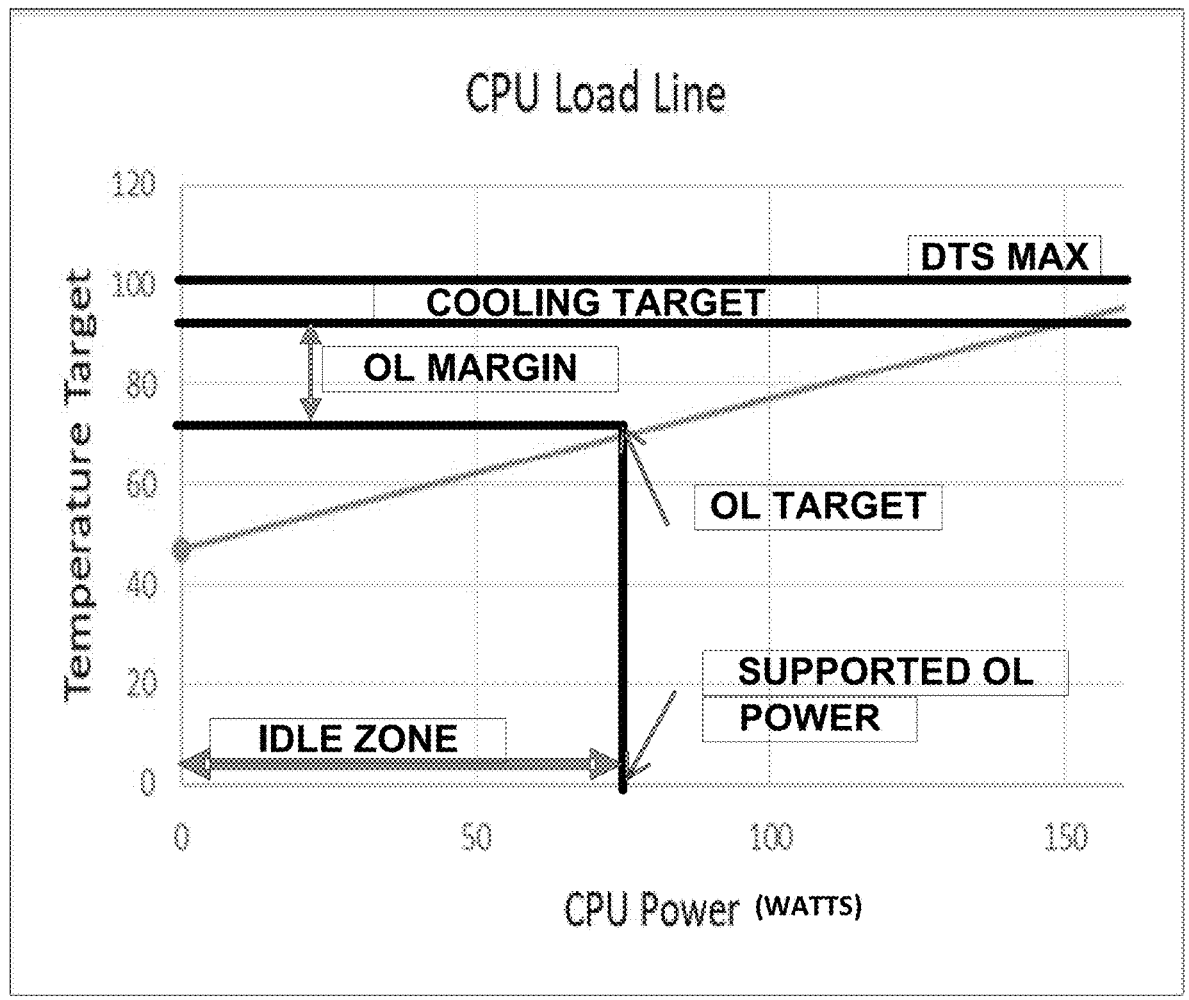
FIG. 4 is a diagram of a temperature target as a function of CPU power, in accordance with an example embodiment of the present disclosure.

FIG. 4 is a diagram 400 of a temperature target as a function of CPU power, in accordance with an example embodiment of the present disclosure. As shown in diagram 400, the open loop temperature target has a linear relationship to the CPU power in this case, such that the idle zone, supported open loop power, open loop target, open loop margin and cooling target can each be determined as a function of the maximum design thermal stress. The temperature spike that should be accommodated can be equal to open loop margin indicated in diagram 400. In the absence of open loop control, the closed loop control process would reduce fan speed as processor power decreases to 25 W watts, but the increase in temperature that could result if power was then increased from watts to the maximum level of 150 watts would cause a temperature that could exceed the maximum design temperature for the processor. By maintaining the fan speed at the open loop target, the system is able to maintain the temperature of the CPU at or below the maximum design temperature, without continuously running the fan at the maximum fan power level (which would maintain the CPU temperature at or below the design maximum temperature, but which would overcool the CPU at lower power levels and would not be needed to prevent overheating under any design operating conditions).

Figure 5:
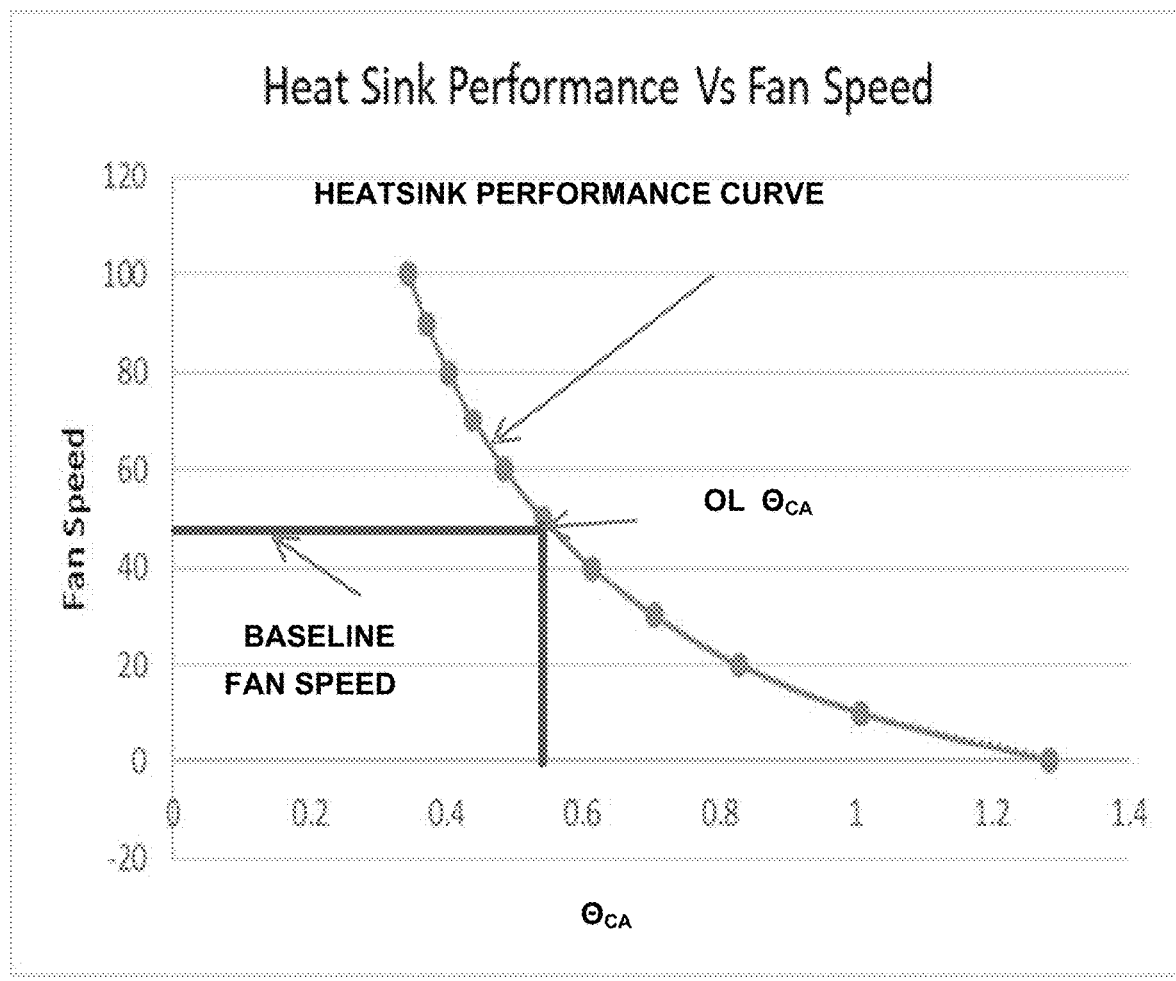
FIG. 5 is a diagram of fan speed as a function of heat sink performance, in accordance with an example embodiment of the present disclosure.

FIG. 5 is a diagram 500 of fan speed as a function of heat sink performance, in accordance with an example embodiment of the present disclosure. As shown in diagram 500, the fan speed has a nonlinear relationship to the value of the case to ambient thermal resistance ($\Theta_{CA}$). As such, the baseline fan speed and open loop $\Theta_{CA}$ can be determined using this relationship.

Figure 6:
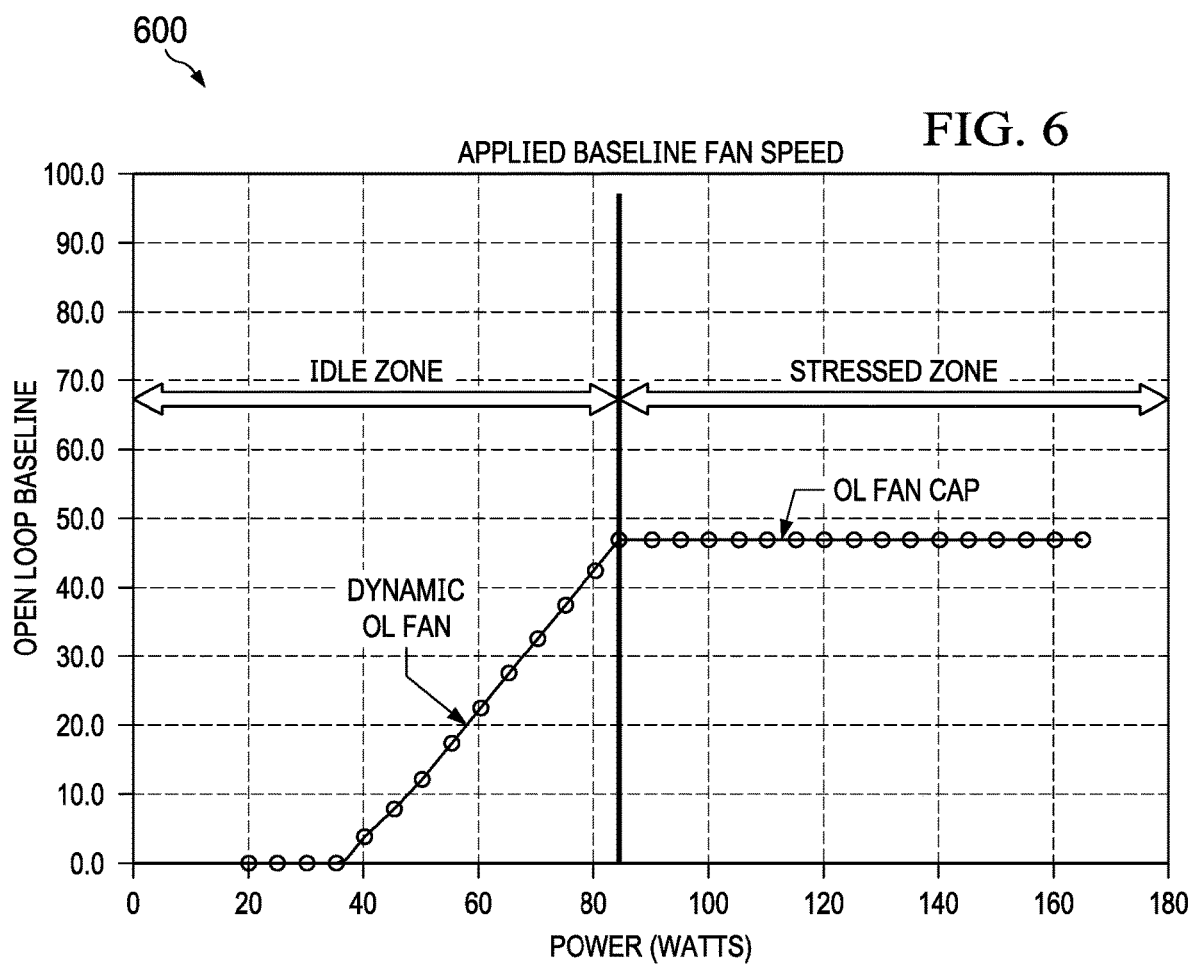
FIG. 6 is a diagram of an open loop baseline as a function of power, in accordance with an example embodiment of the present disclosure.

FIG. 6 is a diagram 600 of an open loop baseline as a function of power, in accordance with an example embodiment of the present disclosure. As shown in diagram 600, the dynamic open loop fan response as a function of power increases in the idle zone until an open loop fan cap is reached, which is maintained for the stressed zone.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. A software system is typically created as an algorithmic source code by a human programmer, and the source code algorithm is then compiled into a machine language algorithm with the source code algorithm functions, and linked to the specific input/output devices, dynamic link libraries and other specific hardware and software components of a processor, which converts the processor from a general purpose processor into a specific purpose processor. This well-known process for implementing an algorithm using a processor should require no explanation for one of even rudimentary skill in the art. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. A system can receive one or more data inputs, such as data fields, user-entered data, control data in response to a user prompt or other suitable data, and can determine an action to take based on an algorithm, such as to proceed to a next algorithmic step if data is received, to repeat a prompt if data is not received, to perform a mathematical operation on two data fields, to sort or display data fields or to perform other suitable well-known algorithmic functions. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:
1. A system for controlling one or more fans, comprising:
an open loop control system configured to receive a CPU power level and to maintain a fan speed at an open loop fan speed level; and a closed loop control system configured to receive the CPU power level and to modify the fan speed as a function of the CPU power level, wherein the fan speed is maintained at a level that is not lower than the open loop fan speed level.

2. The system of claim 1 further comprising a transition control configured to receive the CPU power level and to transition control of the fan speed between the open loop control system and the closed loop control system.

3. The system of claim 1 further comprising a remote access controller configured to determine the open loop fan speed as a function of a system configuration and to store the open loop fan speed in the open loop control system.

4. The system of claim 1 wherein the open loop fan speed is determined using a case to ambient thermal resistance.

5. The system of claim 1 further comprising a remote access controller configured to determine the open loop fan speed as a function of a CPU thermal design power and to store the open loop fan speed in the open loop control system.

6. The system of claim 1 further comprising a remote access controller configured to determine the open loop fan speed as a function of a CPU core count and to store the open loop fan speed in the open loop control system.

7. The system of claim 1 further comprising a remote access controller configured to determine the open loop fan speed as a function of a CPU heatsink performance curve and to store the open loop fan speed in the open loop control system.

8. The system of claim 1 wherein the closed loop system is configured to receive one or more sensor inputs and to modify the fan speed as a function of the one or more sensor inputs, wherein the modified fan speed is maintained at a level that is not lower than an open loop fan speed level.

9. A method for controlling one or more fans, comprising:
receiving a CPU power level at a processor;
determining with the processor whether the CPU power level is greater than an open loop target CPU power level;
maintaining a fan speed at an open loop fan speed with the processor if it is determined that the CPU power level is not greater than the open loop target CPU power level; and
modifying the fan speed as a function of the CPU power level if it is determined that the CPU power level is greater than the open loop target CPU power level, wherein the fan speed is maintained at a level that is not lower than the open loop fan speed level.

10. The method of claim 9 further comprising transitioning control of the fan speed between an open loop control system operating on the processor and a closed loop control system operating on a second processor.

11. The method of claim 9 further comprising:
determining the open loop fan speed as a function of a system configuration using a remote access controller; and
storing the open loop fan speed in an open loop control system.

12. The method of claim 9 further comprising determining the open loop fan speed using a case to ambient thermal resistance.

13. The method of claim 9 further comprising:
determining the open loop fan speed as a function of a CPU thermal design power using a remote access controller; and
storing the open loop fan speed in an open loop control system.

14. The method of claim 9 further comprising:
determining the open loop fan speed as a function of a CPU core count using a remote access controller; and
storing the open loop fan speed in an open loop control system.

15. The method of claim 9 further comprising:
determining the open loop fan speed as a function of a CPU heat sink performance curve using a remote access controller; and
storing the open loop fan speed in an open loop control system.

16. The method of claim 9 further comprising:
receiving one or more sensor inputs; and
modifying the fan speed as a function of the one or more sensor inputs, wherein the modified fan speed is maintained at a level that is not lower than an open loop fan speed level.

17. A system, comprising:
at least one processor; and
at least one memory including computer program code;
the at least one memory and the computer program code are configured, with the at least one processor, to cause the system to perform the steps of:
receiving a CPU power level at the at least one processor;
determining with the at least one processor whether the CPU power level is greater than an open loop target CPU power level;
maintaining a fan speed at an open loop fan speed with the at least one processor if it is determined that the CPU power level is not greater than the open loop target CPU power level; and
modifying the fan speed as a function of the CPU power level if it is determined that the CPU power level is greater than the open loop target CPU power level, wherein the fan speed is maintained at a level that is not lower than the open loop fan speed level.

18. The system of claim 17 further comprising transitioning control of the fan speed between an open loop control system operating on the at least one processor and a closed loop control system operating on a second processor.

19. The system of claim 17 further comprising:
determining the open loop fan speed as a function of a system configuration using a remote access controller; and
storing the open loop fan speed in an open loop control system.

20. The system of claim 17 further comprising determining the open loop fan speed using a case to ambient thermal resistance.

* * * * *